United States Patent [19]

Borghs et al.

[11] Patent Number: 5,779,802

[45] Date of Patent: Jul. 14, 1998

[54] THIN FILM DEPOSITION CHAMBER WITH ECR-PLASMA SOURCE

[75] Inventors: Gustaaf Regina Borghs, Kessel-Lo; Kristin Johanna Leona Deneffe, Meerbeek, both of Belgium

[73] Assignee: IMEC v.z.w., Leuven, Belgium

[21] Appl. No.: 521,788

[22] Filed: Aug. 31, 1995

Related U.S. Application Data

[63] Continuation-in-part of Ser. No. 912,223, Jul. 10, 1992, abandoned, which is a continuation of Ser. No. 634,153, Dec. 10, 1990, abandoned.

[51] Int. Cl.⁶ .................. H05H 1/00; C23C 16/00; C23C 14/00
[52] U.S. Cl. ............... 118/723 MP; 118/723 VE; 118/723 MA; 118/50.1
[58] Field of Search .......... 118/50.1, 723 ME, 118/723 MA, 723 MR, 723 VE, 723 E; 204/298.16; 156/345

[56] References Cited

U.S. PATENT DOCUMENTS 4,683,838   8/1987   Kimura et al. ............ 118/723 VE
4,947,085   8/1990   Nakanishi et al. ........ 118/723 MR
4,950,642   8/1990   Okamoto et al. .......... 505/1
5,022,977   6/1991   Matsuoka et al. ......... 204/298.16

FOREIGN PATENT DOCUMENTS

0 308 266 A2   3/1989    European Pat. Off. ........ H01L 39/12
62-214179      9/1987    Japan ............... C23C 16/48
63-264819      11/1988   Japan ............... H01B 13/00
WO 89/08605    9/1989    WIPO ............... C01B 13/14

*Primary Examiner*—Thi Dang
*Attorney, Agent, or Firm*—McDonnell, Boehnen, Hulbert & Berghoff

[57] ABSTRACT

A process chamber is described wherein a plasma is generated by electron-cyclotron resonance (ECR) and is isolated from chamber walls by a magnetic field from two diametrically-opposed solenoids. A substance to be deposited on a substrate is introduced into the chamber by laser ablation, evaporation, or other techniques. The ECR plasma has a relatively large volume to ensure a homogeneous influx of material, and a low potential that results in less aggressive ion bombardment of the substrate. The process chamber can be used in a variety of processes, including deposition and oxidation of superconducting metal oxides, and reduction of indium-tin-oxide with nitrogen at low temperatures.

8 Claims, 5 Drawing Sheets

THIN FILM DEPOSITION CHAMBER WITH ECR-PLASMA SOURCE

RELATED APPLICATIONS

This application is a continuation-in-part of application Ser. No. 07/912,223 filed Jul. 10, 1992, now abandoned which is a continuation of application Ser. No. 07/634,153 filed Dec. 10, 1990 (now abandoned). This application claims priority under 35 U.S.C. §119 based on application Ser. No. 89.200904.4 filed Apr. 10, 1989 in Europe, application Ser. No. 90.00214 filed Jan. 29, 1990 in the Netherlands, and PCT application PCT/EP90/00602, filed Apr. 10, 1990.

BACKGROUND OF THE INVENTION

1. Field of the Invention

This invention relates generally to apparatus and equipment used for thin-film deposition, and relates more particularly to a chamber having a plasma source that is generated through electron-cyclotron resonance (ECR).

2. Description of the Relevant Art

Plasma-assisted deposition chambers are not new. For example, Japanese Laid-Open Patent Application No. 63-264819 ("Okada") discloses a plasma deposition chamber in which the plasma is generated by a high-frequency power source and is confined by a quartz tube. The chamber is evacuated and back-filled with oxygen and argon. A target composed of a material to be deposited is irradiated with a laser, thereby vaporizing the target material, which reacts with the oxygen in the plasma. An oxide of the laser-ablated material is then deposited on a substrate located adjacent to the quartz tube. The substrate is heated to about 800° C. to improve the adhesive strength and superconducting characteristics of the deposited thin film.

Another reference, Japanese Journal of Applied Physics, Vol. 28, No. 4, April 1989, pp. L635-638 ("Aida"), discloses a plasma chamber that generates an electron-cyclotron resonance (ECR) plasma near a substrate holder by applying a magnetic field and microwave energy, and evaporates in an adjacent chamber the material to be deposited. The plasma is isolated from the chamber wall by a quartz bell jar and a focusing magnetic field.

Yet another reference, EPO Publication 0 308 266 ("Yamazaki"), discloses the use of a magnetic field to obtain a preferred crystal orientation for a thin film superconductor. A plasma is generated in an evacuated chamber through electron-cyclotron resonance (ECR).

Japanese Laid-Open Patent Application No. 62-214179 ("Hoshino") teaches the use of a magnetic field to develop an ECR plasma. However, the magnetic field develops the plasma in a plasma forming chamber which is adjacent to the reaction chamber.

SUMMARY OF THE INVENTION

In accordance with the illustrated preferred embodiment, the present invention provides a thin film deposition chamber with an integrated ECR-plasma source for reactive plasma deposition and low temperature processing.

The deposition chamber is equipped with magnetic coils at opposite sides that generate a magnetic field inside the chamber. A magnetron is coupled to a waveguide and a microwave antenna, the combination of which injects electromagnetic energy into the chamber. A plasma gas, such as $N_2$ or $O_2$ gas, is injected at a pressure of about $5 \times 10^{-4}$ Torr into the chamber, which has a background pressure of $10^{-9}$ Torr. The combination of the microwave energy and the magnetic field creates a plasma of the gas through electron-cyclotron resonance (ECR).

In operation, free electrons rotate around the magnetic fieldlines with a cyclotron frequency of $\omega = e\,\beta/m$. Electrons reaching the place where the magnetic field has a value of 875 Gauss have a cyclotron frequency of 2.45 GHz and are in resonance with the injected microwave field and thus can extract energy from this field. These highly energetic electrons are able to dissociate the $N_2$ or $O_2$ molecules into N or O atoms and to ionize molecules and atoms to generate a plasma. The nitrogen or oxygen plasma is confined in the magnetic bottle generated by the magnetic field pattern and surrounds the substrate.

There are several beneficial aspects and features of the present invention. One aspect of the present invention is that the ECR-plasma operates without large plasma potentials, in contrast with, e.g., rf-parallel plate discharges. Consequently, the ions in the ECR-plasma have a much lower energy and the ion bombardment is less aggressive and will cause less damage to the surface of the substrate. The ECR-plasma of the present invention provides the smallest ion/atom impact on the substrate. Furthermore, the substrate can be electrically biased to reduce or enhance this effect.

Another aspect of the present invention is the large volume of the plasma ensures a homogeneous influx of material used in the growth on the substrate of the deposited material. The large dissociation rate of molecular biatomic gases creates a very efficient and active gas at the substrate surface.

Still another aspect of the present invention is that the ionicity of the plasma influences the growth parameters and allows lower gas pressures and substrate temperatures to achieve the same effect as in a molecular gas environment at much higher pressures and temperatures. This property can be utilized in the oxidation or reduction of certain materials during deposition or after deposition. In a molecular gas, molecules have to be dissociated into atoms by thermal energy, provided by a hot substrate, before they can diffuse into the material. The plasma created by the present invention, by contrast, already contains single atoms and activated ions, resulting in lower substrate temperatures.

For the same reason, much lower temperatures and pressures can be used to obtain the same degree of oxidation or reduction in the plasma than needed in the molecular gas environment. The advantage of decreasing operation temperatures in comparison with the existing deposition techniques in molecular gas, is the reduction of parasitic effects such as interface reactions between the thin film and substrate or interdiffusion between different layers can be limited.

Another aspect of the present invention is that changing the ECR-parameters enables modification of the plasma geometry and composition. The position of the magnet coils in the chamber determines the shape and the location of the plasma plume. Consequently, the plasma plume can be confined to the region in the vicinity of the substrate. Moreover, the exact shape and the plasma density around the substrate can be modified by switching to a different plasma mode by varying the strength of the magnetic field and the microwave power. The plasma can exist in a bulk-mode, in which the plasma is uniform throughout, or a ring mode, in which the plasma is more concentrated at the outer boundaries and is less concentrated at the interior. Thus, the specific ECR-mechanism that produces the plasma, provides the ability to change the characteristics of the plasma in which the substrate is immersed and creates different processing possibilities. Furthermore, the plasma is kept away from the chamber walls due to the geometry of the plasma. Consequently, contamination due to contact of the reactive plasma with the chamber walls is avoided.

Another aspect of the present invention is that substrates can be cleaned prior to deposition of thin films. The substrates are cleaned in an argon or oxygen plasma. Deposition can be performed after cleaning in the same chamber without any further substrate handling.

There are several processing applications for the deposition chamber of the present invention.

Generally, the deposition chamber of the present invention can be used to deposit oxides or nitrides by utilizing an oxygen plasma or a nitrogen plasma, respectively. The present invention can be used to grow metal oxides by laser ablation of a metal target in an oxygen plasma. Growth of nitrides, including metal nitrides and carbon nitride, can be accomplished by the present invention by evaporation with a normal or a high-temperature effusion cell in a nitrogen plasma. Growth of diamond-like nitrides can be accomplished by the present invention by a conventional effusion cell for Al, Ga, In and a nitrogen plasma. Deposition of diamond thin films can be accomplished by the present invention in a $CH_4$ or $CO_2$-$H_2$ plasma.

Another application for the deposition chamber is in the deposition and oxidation of superconducting thin films (metal oxides) in an ECR-oxygen plasma. An ECR-oxygen plasma provides a very effective oxygenation during the layer deposition itself as well as during cooling down of the deposited superconducting layer. When applied during the layer deposition, the ECR-oxygen plasma enables the superconducting layer to grow immediately in the orthorhombic (fully oxygenated) phase whereas in a molecular-oxygen environment the layer grows in the tetragonal phase and a subsequent slow cooling in oxygen is needed to oxidize the sample. When the ECR-oxygen plasma is applied during cooling down of the deposited layer, the oxygen distribution is more homogenous than in the case of cooling in a molecular-oxygen environment.

The present invention is further useful for low temperature fabrication of transparent conducting layers of indium-tin-oxide (ITO). After the deposition of the indium-tin-oxide layer, an annealing step in nitrogen is performed in the chamber of the present invention in a ECR-nitrogen plasma. The annealing step is preferably conducted at a temperature in between room temperature (20° C.) and 150° C., although higher temperature ranges can be used, such as 150° C. to 200° C. or even 200° C. to 400° C. Due to the high mobility of the nitrogen atoms and ions in the plasma, the annealing process can be accomplished at a much lower substrate temperature than the prior technique of annealing in a molecular nitrogen gas at elevated temperatures in excess of 400° C.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENTS

FIGS. 1 through 7 of the drawings depict various preferred embodiments of the present invention for purposes of illustration only. One skilled in the art will readily recognize from the following discussion that alternative embodiments of the structures and methods illustrated herein may be employed without departing from the principles of the invention described herein.

The preferred embodiment of the present invention is a chamber having an integrated ECR-plasma source and useful for reactive plasma deposition and low temperature processing.

Figure 1:
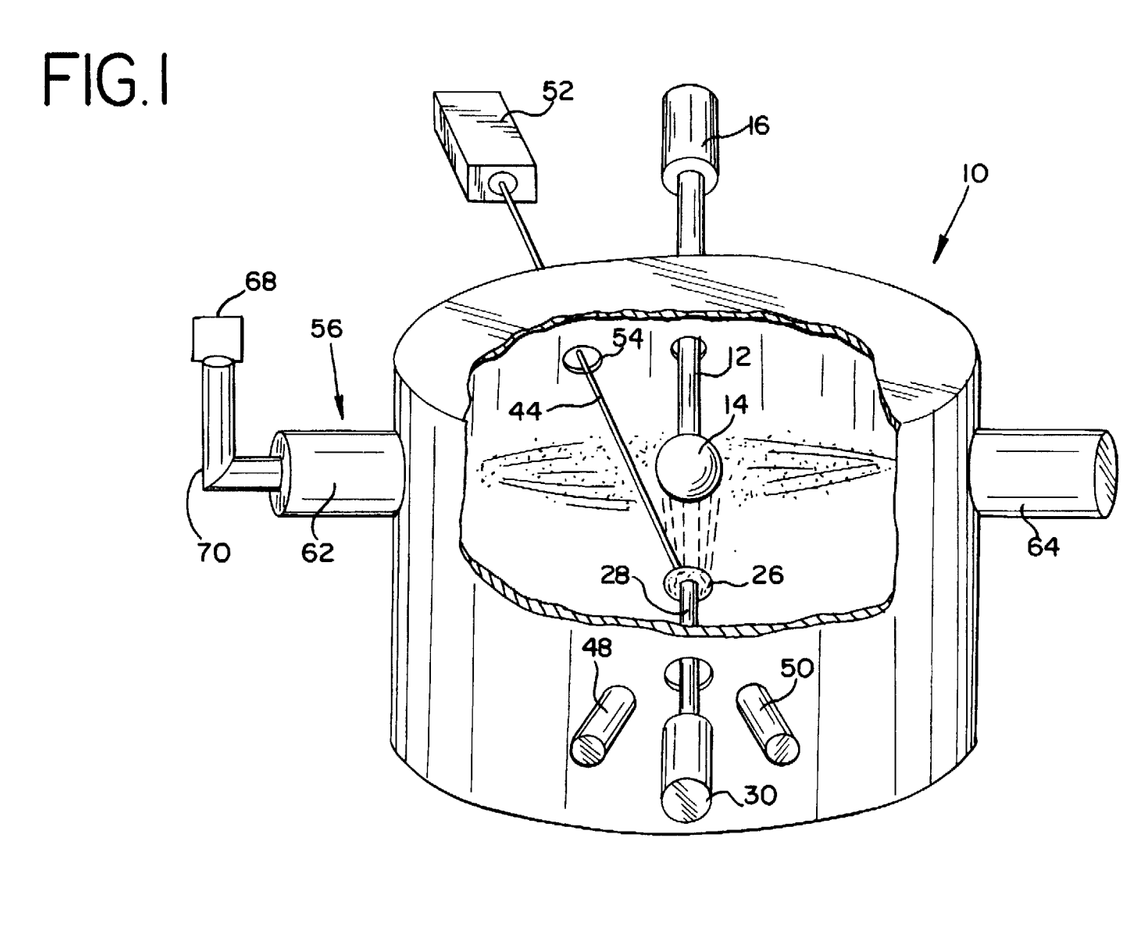
FIG. 1 is a perspective view of a thin film deposition chamber in accordance with the present invention.
Figure 2:
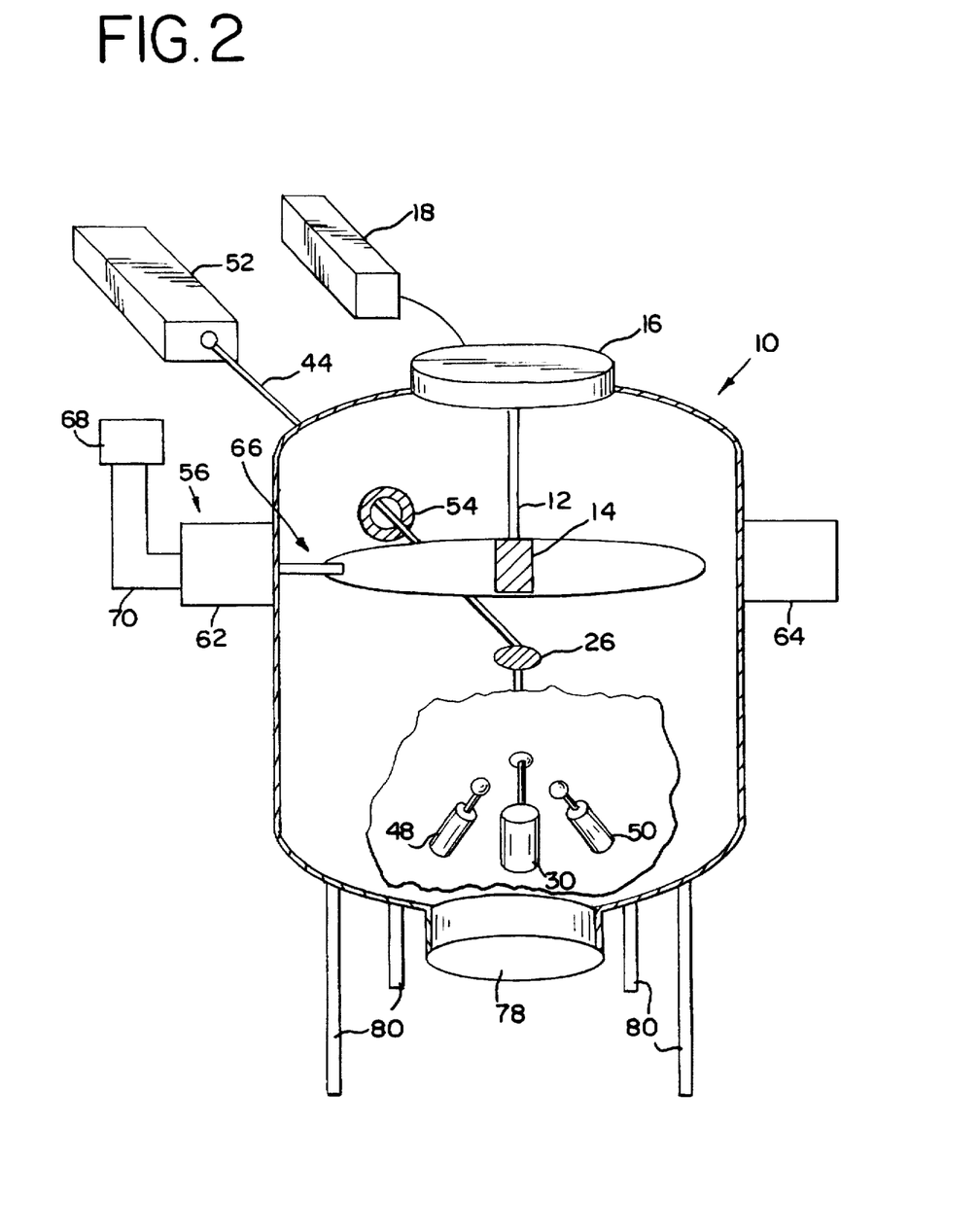
FIG. 2 is a perspective view of a thin film deposition chamber in accordance with another embodiment of the present invention.
Figure 3:
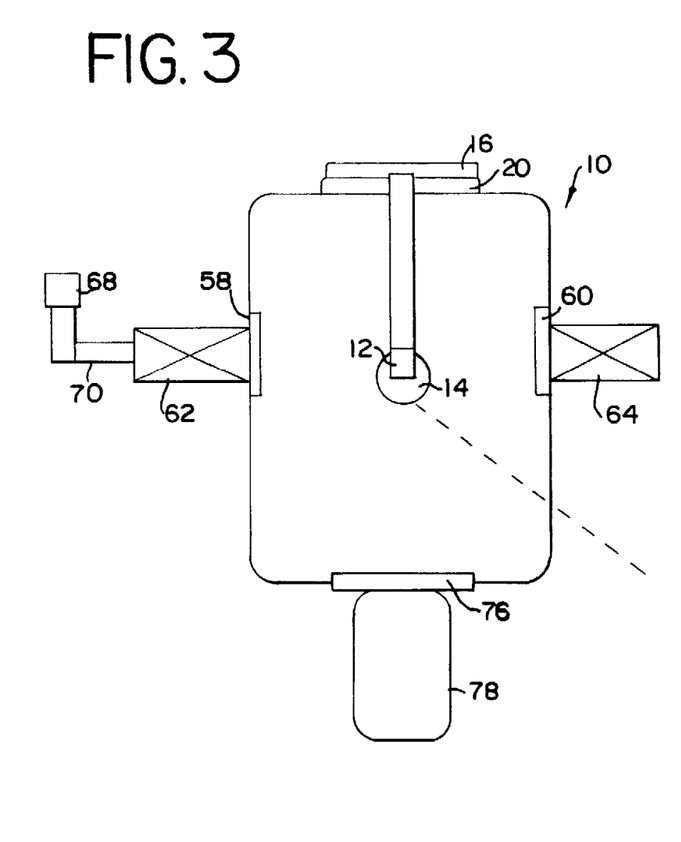
FIG. 3 is a side elevation view of the deposition chamber of FIG. 2.
Figure 4:
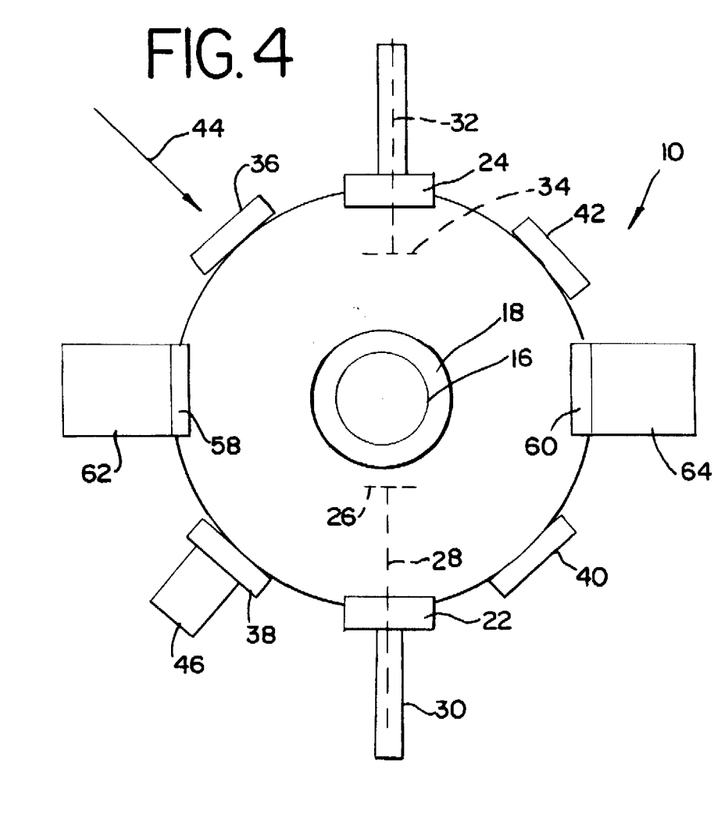
FIG. 4 is a top view of the deposition chamber of FIG. 2.

With reference to FIGS. 1–4, a deposition chamber 10 has a substrate holder 12 upon which can be mounted one or more substrates 14 for processing within the chamber. The substrate holder 12 can be mounted to the side of the chamber 10, as shown in FIG. 1, or can be mounted to top of the chamber, as shown in FIGS. 2–4. The substrate holder preferably includes a rotary drive 16 that rotates the substrate 14 within the chamber and a heater that heats the substrate. A power supply 18 (FIG. 2) is electrically coupled to the substrate 14 through the substrate holder 12 so as to supply a bias voltage and/or current to the substrate. All the devices located within the chamber are preferably made from corrosion resistant materials. The deposition chamber 10 is preferably made of stainless steel and is cylindrical in shape, having a diameter of 50 cm and a height of 70 cm. Several flanges are attached to the chamber 10. A flange 20 (FIG. 3) is located at the top of the chamber 10 and provides a mounting for the heated substrate holder and a pressure gauge (not shown).

Other flanges 22, 24 (FIG. 4) are mounted on the side of the chamber 10. One of these flanges provides a mounting for a pellet 26 of material to be ablated according to known ablation techniques so that material to be deposited on the substrate 14 is released from the piece of material. A holder 28 for the pellet 26 preferably includes a rotary drive 30 for rotating the pellet so that overheating thereof is avoided. The pellet material can be, for example, a pellet of superconducting YBCO material, in which case the pellet can be 5 mm thick and has a diameter of 20 mm. The rotating pellet is positioned facing the substrate 14 at a separation distance of 3 to 7 cm. On the opposite flange 24, an introduction chamber 32 and a transfer system 34 for the substrate are mounted to the chamber. The introduction chamber and transfer system permit loading the substrate 14 without venting the chamber.

As also shown in FIG. 4, four additional flanges 36, 38, 40, and 42 with transparent windows are mounted on the side of the chamber 10. One flange 36 provides a transparent window for an incoming laser beam 44. Another flange provides a transparent window for Rheed diagnostics 46. The remaining two flanges 40, 42 house transparent windows that enable side viewing of the ablation plume and of the mounting of the substrate. As shown in FIGS. 1 and 2, two evaporation cells (Knudsen or effusion cells) 48, 50 are mounted on the chamber 10. In addition, an ion gauge and a quadrupole mass spectrometer can be mounted on the chamber.

A laser beam 44 is generated by a laser 52 and is directed through an entrance or window 54 onto the pellet 26. Preferably, the laser 52 used to radiate the pellet 26 is a Quanta Ray model GCR-3 frequency tripled Nd:YAG laser. At a wavelength of 355 nm, this device has a pulse energy of 0.25 J and a pulse duration of 6 ns. The laser beam 44 is not focused, has a diameter of 7 mm and thus produces a fluence of 0.5 J/cm$^2$. Irradiation is carried out of 10 Hz for optimum stability and is incident near 15° to the target surface normal. The laser 52 is preferably galvanically controlled so that patterns can be written onto the pellet 26 or the substrate 14.

An ECR source 56 is mounted to the side of chamber 10 on two large (200 mm) flanges 58, 60. On the flanges 58, 60 are mounted water-cooled magnet coils or solenoids 62, 64 that generate a magnetic field having a field strength of 875 Gauss within the chamber.

Figure 5:
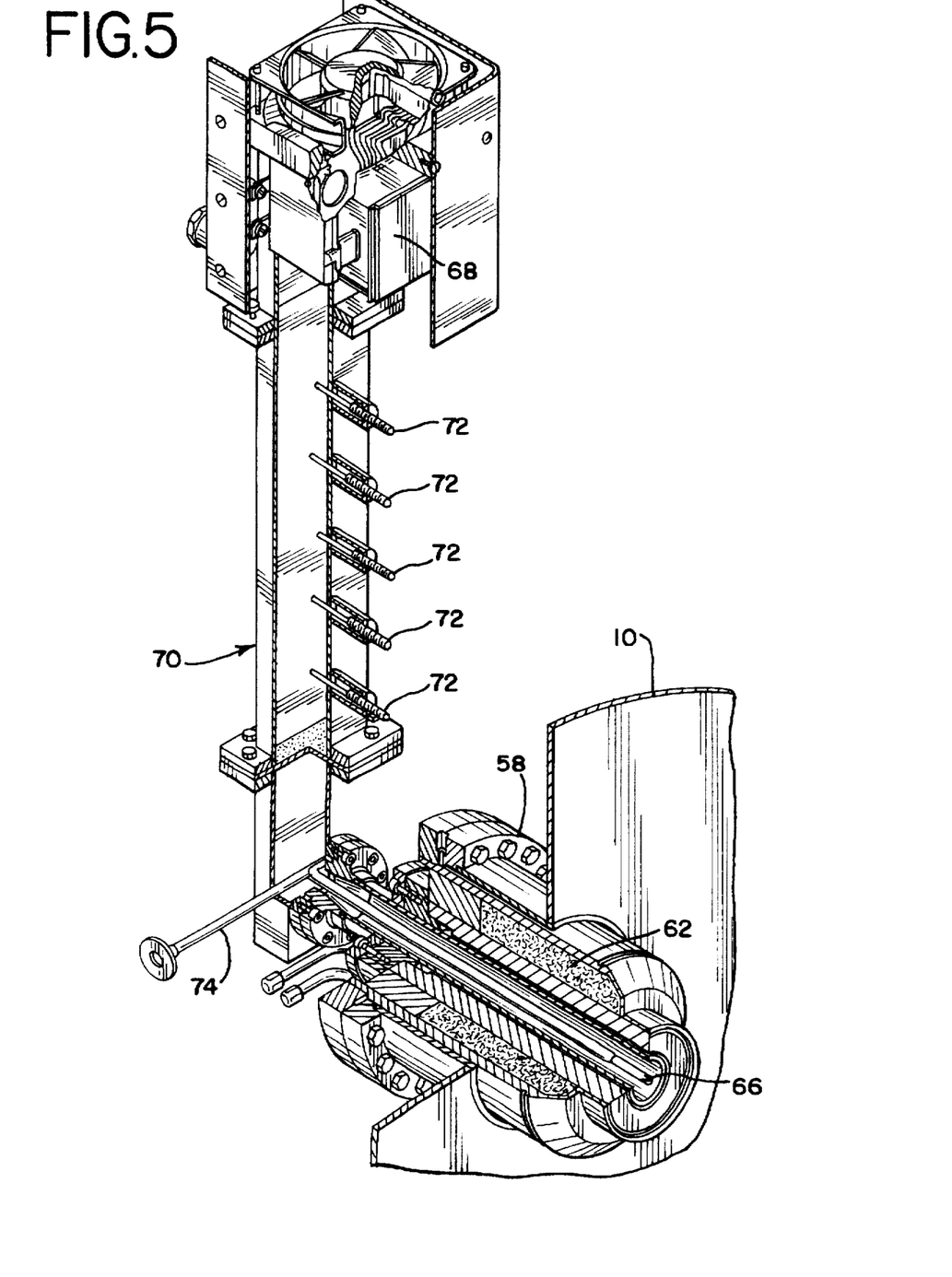
FIG. 5 is a perspective view, partially cut-away, of a microwave power source of the present invention.

Mounted to the center of flange 58, a coaxial antenna 66 delivers microwaves of 2.45 GHz inside the chamber 10. A magnetron 68 generates the microwave radiation at 2.45 GHz, up to a maximum of 300 W. The microwave output of the magnetron is delivered via a waveguide structure 70 fitted with five mobile circuit terminations 72 for impedance matching to the antenna 66. FIG. 5 gives a detailed illustration of the magnetron 68, the waveguide 70, and the coaxial antenna 66.

The plasma gas is introduced to the chamber through the coaxial conductor of the antenna 66 and regulated by means of a needle-valve 74 to provide the desired background pressure in the chamber.

A flange 76 is located at the bottom of the deposition chamber 10 for attachment of a vacuum pump 78. The pump is preferably resistive to corrosive gases and has a variable speed to keep the chamber 10 at low pressure ($10^{-9}$ Torr, for example) prior to introduction of the gas. Legs 80 support the chamber 10.

To obtain an ECR-plasma, microwave radiation is injected through the antenna 66 into the deposition chamber 10 in which a static magnetic field and a certain gas pressure are present. Plasma ignition is reached when the frequency of the incoming microwave radiation and the cyclotron frequency of the free electrons in the magnetic field are equal, following the formula:

$$\omega_{electron} = eB/m = \omega_{microwave}$$

At 2.45 GHz, electron resonance conditions are achieved in regions where the magnetic field value equals 875 Gauss ($=875.10^{-4}$ Tesla).

The highly energetic electrons dissociate and ionize the gas ($O_2$, $N_2$, Ar, $CH_4$, or other gas) molecules to generate a plasma. The plasma is confined by the magnetic field. The 875 Gauss regions act as magnetic mirrors and the plasma is confined to a cylindrical region of perhaps 50 cm long and a diameter that can vary from about 5 cm to about 10 cm depending on the magnetic field parameters. The plasma is transported over the substrate along the magnetic field lines so as to avoid interaction with the chamber walls.

Plasma operation is possible over a wide range of gas pressure. The gas pressure used during plasma operation is between $10^{-3}$ and $10^{-5}$ Torr; at higher or lower pressures plasma ignition is impossible.

Figures 6A, 6B, 7:
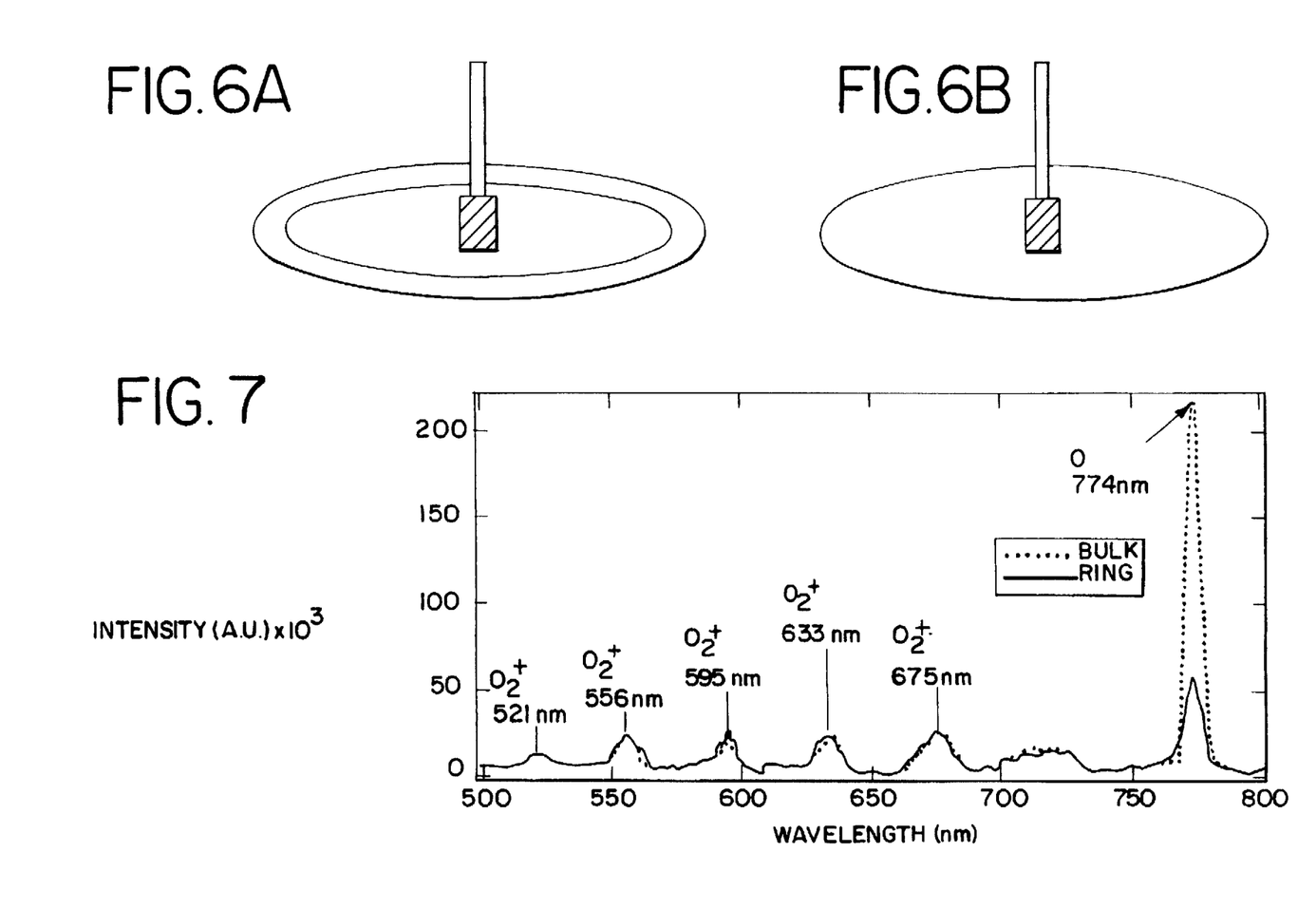
FIGS. 6a and 6b are schematic representations of a ring-plasma mode and a bulk-plasma mode, respectively, of a plasma within the deposition chamber of the present invention.
FIG. 7 is a graph of the optical emission spectrum of an oxygen-ECR plasma of the present invention.

The plasma is sustained in different plasma modes, depending on the ECR parameters being current in the magnet coil, injected microwave power and gas pressure. At low pressure, microwave power and magnet current, the plasma operates in a ring mode formed by the 875 Gauss field lines, with little diffusion towards the middle of the ring. This condition is shown in FIG. 6A. The plasma density in the vicinity of the substrate is low in this case.

At higher values of current, power, and pressure, the excited species diffuse towards the middle of the ring and a nearly homogeneous plasma cloud is formed around the substrate. This bulk mode of the plasma is shown in FIG. 6B. The plasma density near the substrate can thus be varied by tuning the different ECR parameters—current in the magnet coil, injected microwave power and gas pressure. Consequently the incorporation of the plasma material in the deposited film can be altered by altering the mode of the plasma.

The introduction of a substrate holder 12 and the manipulator in the plasma does not disturb the operation of the plasma. The surface of the substrate 14 (or the substrate holder 12) can be biased by the power supply 18 to attract ions or electrons. For example, in oxide growth applications a positive bias can enhance the amount of $O^-$ ions in the vicinity of the sample or in etch applications the etch rate can be increased by biasing the substrate.

The characteristic atomic and ionic optical transitions present in excited gas spectrum can be used to analyze the plasma. This makes the optical on-line monitoring of the gas content possible.

The optical emission spectrum of the plasma can indicate whether the plasma is in the bulk mode or the ring mode. An optical emission spectrum of an $O_2$-ECR plasma is shown in FIG. 7. The atomic oxygen emission of the bulk-mode plasma is significantly higher than that of the ring-mode plasma. A comparison of the spectrum in the bulk mode and the ring mode of the plasma shows that the atomic density increases relative to the density of the other species when switching from a ring to a bulk plasma. It is clear from these measurements that the density of atomic species can be tuned with the ECR-parameters. Since the atoms play a major role in the oxidation and reduction processes, this tuning ability creates a wide variety of processing possibilities in the deposition chamber.

The injected gas, such as oxygen or nitrogen, is ionized at the 875 Gauss spots and enters a plasma state in the area between the two spots so that the plasma is subsequently confined therein. The generated ions are transported along or constrained by the magnetic field lines that surround the substrate. Since interaction with the chamber walls is avoided, a pure and clean plasma is produced, resulting in pure and clean layers. The microwave system shown here does not require, and preferably does not have, a separate discharge cell or an extra quartz tube for keeping the plasma away from the walls of the chamber.

An efficient transporting of the oxygen containing plasma takes place over the substrate along the magnetic field lines because of the dimensioning of the magnetic field. Even at a pressure of only $10^{-3}$ to $10^{-5}$ Torr, the plasma will ignite.

It will be apparent that with the device shown, superconducting layers can be deposited in their superconducting phase without post-cooling in oxygen atmosphere due to the reactivity of the ECR plasma. Optional passivation of a superconducting layer using an oxide layer can be performed without oxygen being extracted from the superconducting layer as sufficient oxygen can be brought into the plasma.

Both etching using a plasma and writing patterns using a laser is possible with the device shown, wherein removing the substrate from the vacuum chamber is avoided, and therefore introducing impurities and is also avoided. The device can also be used for deposition of other layers such as diamond or epitaxial silicium.

The deposition chamber of the present invention is designed for compound thin film deposition processes in which one of the constituent materials of the deposited film originates from the ECR plasma. Two different types of deposition are possible: ECR reactive laser ablation and ECR reactive thermal evaporation. The system can be adapted to include a sputtering system as well. This combination also enables in-situ plasma treatment of the layers immediately after the deposition. The active plasma or plasma-assisted laser ablation and thermal evaporation can be combined in-situ, e.g., depositing multiple layers with laser ablation and evaporation successively without venting the chamber or, for example, evaporation of metal contacts on a plasma reactive laser ablated metal oxide layer.

The main features of this invention are related to the plasma and the combination of the plasma with different types of depositions. More specifically, the features include: (1) the specific geometry of a large plasma which allows the combination of different deposition techniques; (2) the reduction of the contamination from walls cavity in which the plasma is created because the plasma is confined by magnetic field lines inside the vacuum chamber; (3) the well-controlled energy of the plasma particles because the plasma is not extracted from a remote plasma source but the sample is immersed in the plasma during action; and (4) by carefully biasing the substrate, the impact of ions on the substrate can be tuned and the atomic density near the substrate can be altered.

The present invention is useful for plasma assisted growth. Metal oxide and nitride and semiconductor nitride films are grown using the ECR microwave assisted epitaxial growth method. Conventional cells are used to evaporate Ga, In, Al, Fe, or other materials. Atomic and ionic oxygen, nitrogen, or other active gases are produced by the ECR plasma source. The substrate is at the optimum temperature of growth which makes epitaxy on the substrate surface possible.

In the same way, ECR active laser ablation of metal oxides, metal nitrides, carbon nitrides, and other materials can be grown in this system. The same principles are valid as for normal evaporation. The range of choice of gases is larger for ablation than for normal evaporation because most of the heating filaments in normal evaporation cells are corroded by the plasma gas.

The present invention is useful for depositing a layer of superconductor material. A superconducting layer of $Y_1Ba_2Cu_3O_{7-\delta7}$ (YBCO) was grown in an oxygen-ECR plasma with an oxygen pressure of $5 \times 10^{-4}$ Torr and then "quenched" i.e. chilled as quickly as possible. The resistance of the deposited layer was measured. On rough (roughness 5 microns), unpolished, polycrystalline YSZ (yttrium stabilized $ZrO_2$) substrate, an onset temperature of 85° K. was obtained. The offset (R=O) temperature was 75° K. These results are the best that can be expected when using an YSZ substrate.

In order to prove that the reactive excited oxygen atoms and ions guarantee a sufficient oxidation of every layer, two identical YBCO layers were grown using the above-mentioned device and according to the above-mentioned method. One of the layers was grown in the presence of the oxygen plasma while the other one was grown in the presence of neutral oxygen molecules. Measuring the resistance showed that the first layer was superconductive while the second one was not.

The partial oxygen pressure used in these experiments is measured by turning a Bayert-Alpert gauge to the place where the substrate is located during deposition and is maximally $5 \times 10^{-4}$ Torr. At this pressure plasma ignition is possible. Electron resonance conditions are achieved at 10 cm from both sides of the substrate where the magnetic field value is 875 Gauss. The plasma is transported along the magnetic fieldlines and the substrate. The 875 Gauss regions act as magnetic mirrors and the plasma is confined to a cylindrical region of 50 cm long and 6 cm in diameter which is visible due to its yellow light.

The present invention is further useful for low temperature fabrication of transparent conducting layers of indium-tin-oxide. Indium-tin-oxide (ITO) is an ideal contact layer for use in optical applications since it is a transparent, well conducting material. After the deposition of the indium-tin-oxide layer (e.g., by sputtering), an annealing or reduction step in nitrogen is required to obtain a conducting layer. Prior annealing methods have utilized a molecular $N_2$ gas or forming gas (90% $N_2$+10% $H_2$) environment, in which annealing temperatures of 400° C. to 500° C. are needed to provide the required thermal energy in order to dissociate the $N_2$ molecules into atoms that can diffuse into the ITO layer.

The present invention provides low temperature processing (20° C. to 150° C. or higher) of the ITO layer by annealing (reduction) in a ECR-nitrogen plasma. It appears that the diffusion mechanism to reduce the ITO layer and increase its conductivity is based on an indiffusion of atomic N particles due to their lower diffusion energy than the molecule. In the prior technology, this dissociation occurs thermally at the surface of the ITO layer and thus requires substantially elevated temperatures. According to the present invention, however, the dissociation occurs based on the ECR principle and is thus independent of the temperature of the ITO layer. A substrate temperature of 20° C. to 150° C. or higher is sufficient because it is not used for dissociation but only to overcome the indiffusion barrier of the N atoms. As a result, the annealing or reduction process can be accomplished at a much lower substrate temperature that is compatible with low temperature processing of underlying devices.

A comparison between the ECR-plasma-processed ITO film and the classically high-temperature-prepared ITO film shows that about the same resistivities are obtained by the present invention with a lower number of carriers but with a higher mobility. In the ECR plasma, a temperature of about 20° C. to 150° C. or higher is high enough to overcome the indiffusion barrier of the N atoms and yields resistivities as low as the values obtained by a classical annealing process in molecular $N_2$ or forming gas at 450° C. While the temperature range of 20° C. to 150° C. is preferred, elevated temperatures in the range of 150° C. to 200° C. or even 200° C. to 400° C. may also be beneficial to speed up the diffusion process.

From the above description, it will be apparent that the invention disclosed herein provides a novel and advantageous thin film deposition chamber with an integrated ECR-plasma source for reactive plasma deposition and low temperature processing. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A process chamber comprising:

a sealed chamber having walls, means for generating a vacuum in the chamber;

a substrate holder disposed within the chamber and including means for holding a substrate;

means for introducing a gas into the chamber;

means for generating by electron-cyclotron resonance a gas plasma and for magnetically confining the plasma to a region surrounding the substrate holder and isolated from the walls of the chamber, wherein said means includes two solenoids mounted on diametrically opposite sides of the chamber for generating a magnetic field within the chamber and further includes means for supplying microwave energy to the chamber; and means for supplying particles of a substance to be deposited on the substrate wherein said means for supplying particles includes a target holder disposed within the chamber, a target of said substance mounted on the target holder within the chamber, and a laser that illuminates the target to thereby ablade particles of the substance from the target.

2. A process chamber as recited in claim 1 wherein said target holder includes means for rotating the target.

3. A process chamber as recited in claim 1 wherein the target is composed of $Y_1Ba_2Cu_3O_{7-\delta}$.

4. A process chamber as recited in claim 1 wherein said means for supplying particles includes an evaporation cell coupled to the chamber, wherein the evaporation cell evaporates and supplies particles of the substance to the chamber.

5. A process chamber as recited in claim 1 further comprising means for heating the substrate and means for electrically biasing the substrate.

6. A process chamber as recited in claim 1 further comprising means for changing the density of the gas plasma in the vicinity of the substrate by controlling the strength of the magnetic field, the power of the microwave energy, or the pressure of the gas within the chamber.

7. A process chamber as recited in claim 6 further comprising means for optically monitoring the density of the gas plasma in the vicinity of the substrate by measuring the optical emission spectrum of the plasma.

8. A process chamber comprising:

a sealed chamber having walls;

means for generating a vacuum in the chamber;

a substrate holder disposed within the chamber, wherein the substrate holder includes means for holding a substrate;

means for heating the substrate;

means for electrically biasing the substrate;

means for introducing a gas into the chamber;

means for generating by electron-cyclotron resonance a gas plasma and for magnetically confining the plasma to a region surrounding the substrate holder and isolated from the walls of the chamber, wherein said means includes two solenoids mounted on diametrically opposite sides of the chamber and further includes means for supplying microwave energy to the chamber;

means for laser ablating a target of a substance to be deposited on the substrate, wherein said laser means includes a rotatable target holder disposed within the chamber, a target of said substance mounted on the target holder, and a laser that illuminates the target to thereby ablade particles of the substance from the target; and means for changing the density of the gas plasma in the vicinity of the substrate by controlling the strength of the magnetic field, the power of the microwave energy, or the pressure of the gas within the chamber.

* * * * *